United States Patent
Ryu

(10) Patent No.: US 9,659,667 B2
(45) Date of Patent: May 23, 2017

(54) CIRCUIT FOR READING ONE TIME PROGRAMMABLE MEMORY

(71) Applicant: Magnachip Semiconductor, Ltd., Seoul (KR)

(72) Inventor: Beom Seon Ryu, Cheongju-si (KR)

(73) Assignee: MagnaChip Semiconductor, Ltd. (KR)

(*) Notice: Subject to any disclaimer, the term of this patent is extended or adjusted under 35 U.S.C. 154(b) by 0 days.

(21) Appl. No.: 15/130,650

(22) Filed: Apr. 15, 2016

(65) Prior Publication Data

US 2016/0329107 A1    Nov. 10, 2016

(30) Foreign Application Priority Data

May 8, 2015  (KR) ......................... 10-2015-0064824

(51) Int. Cl.

| G11C 17/00 | (2006.01) |
|---|---|
| G11C 17/18 | (2006.01) |
| G11C 17/16 | (2006.01) |
| G11C 7/02 | (2006.01) |
| G11C 7/22 | (2006.01) |

(52) U.S. Cl.
CPC ................ *G11C 17/18* (2013.01); *G11C 7/02* (2013.01); *G11C 7/222* (2013.01); *G11C 17/16* (2013.01)

(58) Field of Classification Search
CPC ..................................................... G11C 17/16
USPC ............................................................ 365/96
See application file for complete search history.

(56) References Cited

U.S. PATENT DOCUMENTS

| 8,199,552 B2 | 6/2012 | Shin et al. | |
|---|---|---|---|
| 2013/0176765 A1* | 7/2013 | Furukawa | G11C 17/12 365/96 |

* cited by examiner

*Primary Examiner* — Hoai V Ho
(74) *Attorney, Agent, or Firm* — McGuireWoods LLP

(57) ABSTRACT

A circuit for reading a one time programmable (OTP) memory includes a controller that receives a read input signal and generates a read delay signal, a read voltage signal, and a read latch signal; a read voltage generator that generates a read voltage based on the read voltage signal and outputs the read voltage to a detecting node; an OTP memory unit cell including a first electrode connected to the detecting node; a first detecting unit that determines a voltage at the detecting node; a determining unit that delays an output signal from the first detecting unit based on the read delay signal; and a latch unit that latches an output signal from the determining unit during a first delay time at a falling edge of the read input signal based on the read latch signal.

20 Claims, 4 Drawing Sheets

CIRCUIT FOR READING ONE TIME PROGRAMMABLE MEMORY

CROSS-REFERENCE TO RELATED APPLICATIONS

This application claims priority and the benefit thereof from Korean Patent Application No. 10-2015-0064824, filed on May 8, 2015 in the Korean Intellectual Property Office, the disclosure of which is incorporated herein by reference in its entirety.

BACKGROUND

1. Field

The present disclosure relates to a One Time Programmable (OTP) Memory, and more specifically it relates to a circuit for reading a OTP memory.

2. Description of Related Art

An OTP memory is a non-volatile memory that, once programmed, can no longer perform a programming operation and can only perform a reading operation. A fuse type cell structure is widely used as a unit-cell of an OTP memory. The fuse type unit cell reads a data value based on whether a fuse is electrically short or not.

An anti-fuse is a type of an OTP memory using the fuse type cell that does not require an addition process to form a fuse mainly because a transistor gate oxide layer is used as the fuse. The anti-fuse uses an oxide layer. The anti-fuse is electrically opened prior to executing a programming operation and operates as a capacitor. Once it is programmed, the anti-fuse becomes electrically short as the gate oxide layer is destroyed.

The programming operation of an anti-fuse involves applying a high voltage that is higher than a break-down voltage, thereby destroying the gate oxide layer. A read operation involves applying a positive voltage supply (VDD) or a negative voltage supply (VSS) to a detecting node that is connected to the anti-fuse, outputting a predetermined current and reading whether the anti-fuse is electrically short by measuring the voltage at the detecting node. If the anti-fuse is in an electrically short state after the programming operation, the voltage at the detecting node changes as a current is applied through the anti-fuse. However, if the anti-fuse is electrically open, the voltage at the detecting node becomes a read voltage. That is, when the anti-fuse is viewed as a resistance, the anti-fuse in an electrically open state has an unlimited resistance. Accordingly, the voltage at the detecting node is determined by a read voltage, but when the anti-fuse is electrically short, the voltage at the detecting node is determined based on a resistance ratio of a read voltage generator and the anti-fuse that are connected in series.

Herein, although a gate oxide layer of an anti-fuse is destroyed, the detecting node cannot completely converge to the VDD or the VSS that is connected to a different electrode of the anti-fuse since the anti-fuse has a predetermined resistance value. Accordingly, the circuit for reading an OTP memory needs to obtain a margin of a logic threshold voltage to improve a detecting rate of the detecting node.

The circuit for reading an OTP memory reads a voltage at the detecting node during a read operation, which improves a detecting rate using, for example, a buffer with an adjusted logic threshold voltage, a differential amplifier, or the like.

However, an anti-fuse resistance has a predetermined range of error due to irregularities, such as, for example, temperature, process variables, and the like. Further, a voltage of an anti-fuse gate electrode can fluctuate due to exposure to various forms of noise. Herein, when the voltage of the detecting node connected to the anti-fuse fluctuates at a logic threshold voltage level, a buffer or a differential amplifier may output a wrong signal due to the fluctuation of the voltage at the detecting node.

Further, an amplifier to improve the detecting rate consumes additional voltage and current, and thus requires additional space for a circuit to provide such voltage and current to the amplifier.

Generally, after manufacturing an OTP memory, testing is performed to determine whether it is programmed or not at a stable voltage and room temperature. However, in reality, OTP memories are used in different environments and conditions, and OTP memories that have been determined to be normal during the testing may operate abnormally in a real-life environment. Accordingly, there may be credibility issues with the test result because the read voltage margin may not be obtained.

SUMMARY

One aspect of the present disclosure provides a circuit for reading a one time programmable (OTP) memory. The circuit includes a controller that receives a read input signal and generates a read delay signal, a read voltage signal, and a read latch signal, a read voltage generator that generates a read voltage based on the read voltage signal and outputs the read voltage to a detecting node, an OTP memory cell unit including a first electrode connected to the detecting node, a first detecting unit that determines a voltage at the detecting node, a determining unit that delays an output signal from the first detecting unit based on the read delay signal, and a latch unit that latches an output signal of the determining unit during a first delay time at a falling edge of a read input signal based on the read latch signal.

The read delay signal may be generated by delaying the read input signal for a period of the first delay time. The read voltage signal may be at a high level during a period from a rising edge of the read input signal to a falling edge of the read delay signal. The read latch signal may be at a high level for the period of the first delay time at a rising edge and a falling edge of the read input signal.

The controller may include a delay circuit.

The controller may include a buffer that generates a read delay signal by buffering an output signal from the delay circuit.

The controller may include a logic circuit that generates the read voltage signal based on the read input signal and an output signal from the delay circuit. The controller may include an OR gate.

The controller may include a logic circuit that generates the read latch signal based on the read input signal and output signal from the delay circuit. The logic circuit may include a XOR gate.

The read voltage generator may output a first current in a general mode and may output a second current in a test mode. The second current may be larger than the first current.

The read voltage generator may include first and second pull-up units, a first transfer gate connected between the first pull-up unit and the detecting node, a second transfer gate connected between the second pull-up unit and the detecting node, and a switch unit that controls the first transfer gate and second transfer gate.

The first detecting unit may include a Schmitt trigger circuit.

The determining unit may include a transfer gate configured to block connection with the first detecting unit based on the read delay signal, a second detecting unit which buffers an output signal of the first detecting unit, and a precharge unit that precharges an input terminal and an output terminal of the second detecting unit based on the read delay signal.

The second detecting unit may include a first inverter and a second inverter. An input terminal of the first inverter may be connected to an output terminal of the second inverter. An input terminal of the second inverter may be connected to an output terminal of the first inverter.

The first inverter may include a pull-up unit including a gate electrode connected to the output terminal of the second inverter and a pull-down unit including a gate electrode connected to the output terminal of the precharge unit.

The precharge unit may include a first pull-down unit configured to pull-down an input terminal of the second detecting unit and a second pull-down unit configured to pull down the output terminal of the second detecting unit.

Additional features, advantages, and embodiments of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWING

The accompanied drawings, which are included to provide a further understanding of the disclosure, are incorporated in and constitute a part of this specification, illustrate embodiments of the disclosure and together with the detailed description serve to explain the principles of the disclosure. No attempt is made to show structural details of the disclosure in more detail than may be necessary for a fundamental understanding of the disclosure and the various ways in which it may be practiced.

DETAILED DESCRIPTION

Figure 1:
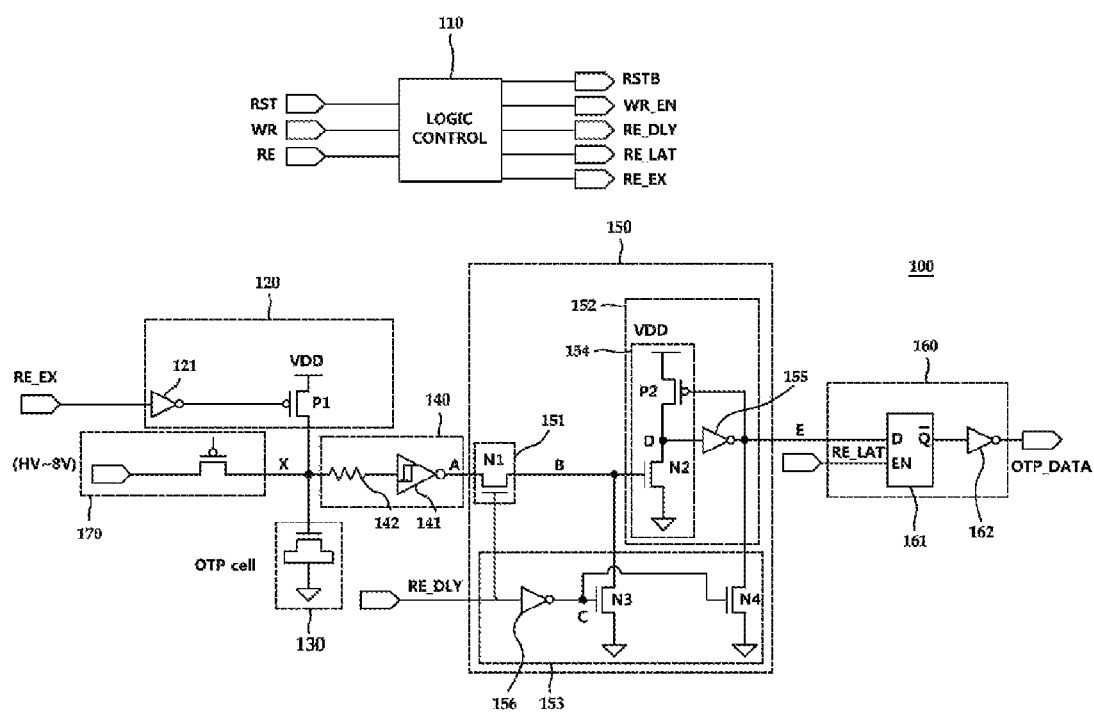
FIG. 1 illustrates an example of a circuit for reading an OTP memory according to an embodiment of the present description.

The disclosure and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the disclosure. The examples used herein are intended merely to facilitate an understanding of ways in which the disclosure may be practiced and to further enable those of skill in the art to practice the embodiments of the disclosure. Accordingly, the examples and embodiments herein should not be construed as limiting the scope of the disclosure. Moreover, it is noted that like reference numerals represent similar parts throughout the several views of the drawings.

The terms "including," "comprising" and variations thereof, as used in this disclosure, mean "including, but not limited to," unless expressly specified otherwise.

The terms "a," "an," and "the," as used in this disclosure, means "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

Although process steps, method steps, or the like, may be described in a sequential order, such processes and methods may be configured to work in alternate orders. In other words, any sequence or order of steps that may be described does not necessarily indicate a requirement that the steps be performed in that order. The steps of the processes or methods described herein may be performed in any order practical. Further, some steps may be performed simultaneously.

When a single device or article is described herein, it will be readily apparent that more than one device or article may be used in place of a single device or article. Similarly, where more than one device or article is described herein, it will be readily apparent that a single device or article may be used in place of the more than one device or article. The functionality or the features of a device may be alternatively embodied by one or more other devices which are not explicitly described as having such functionality or features.

FIG. 1 illustrates an example of a circuit 100 for reading an OTP memory, which is constructed according to an embodiment of the present description.

The circuit 100 may include a controller 110, a read voltage generator 120, an OTP memory unit cell 130, a first detecting unit 140, a determining unit 150, a latch unit 160, a program voltage applying unit 170, and/or the like. The controller 110 may generate a read voltage signal (RE_EX), a read delay signal (RE_DLY), and a read latch signal (RE_LAT), and/or the like, based on a read input signal (RE) applied thereto. The read voltage generator 120 may receive the read voltage signal (RE_EX) from the controller 110, and generate and apply a read voltage to a detecting node (X). Other units may also be connected to the detecting node (X). For example, the OTP memory unit cell 130 may include a first electrode connected to the detecting node (X) and the first detecting unit 140 may include an input terminal connected to the detecting node (X). The determining unit 150 may include an input terminal connected to an output terminal of the first detecting unit 140. The latch unit 160 may include an input terminal connected to an output terminal of the determining unit 150. The program voltage applying unit 170 may destroy a gate oxide layer, for example, by applying a high voltage to the first electrode of the OTP memory unit cell 130 during a programming operation.

The controller 110 may include one or more input terminals and a plurality of output terminals. For example, an input terminal of the controller 110 may receive the read input signal (RE). The controller 110 may further include input terminals for receiving a program input (or write) signal (WR), a reset input signal (RST), and/or the like. The output terminals of the controller 110 may output the read voltage signal (RE_EX), the read delay signal (RE_DLY), the read latch signal (RE_LAT) and/or the like. The controller 110 may generate and output other signals. For example, the controller 110 may generate and output a program control signal (WR_EN) based on the program input signal (WR), and may also generate and output a reset control signal (RSTB) based on the reset input signal (RST). The features of the controller 110 are described hereinafter referring to FIG. 2.

The read voltage generator 120 may include a pull-up unit (P1), which may be a metal-oxide-semiconductor field-effect transistor (MOSFET). A source electrode of the pull-up unit (P1) may be connected to a positive voltage supply (VDD). A gate electrode of the pull-up unit (P1) may receive the read voltage signal (RE_EX). A drain electrode of the pull-up unit (P1) may be connected to the detecting node (X). The read voltage generator 120 may further include a NOT gate 121 or a buffer that receives the read voltage signal (RE_EX), and the buffered read voltage signal (RE_EX) may be applied to a gate electrode of the read voltage generator 120. In FIG. 1, the read voltage generator 120 is constructed with the pull-up unit (P1) which is connected to the VDD. However, the read voltage generator 120 may be constructed with different elements, such as, for example, a pull-down unit that is connected to a negative voltage supply (VSS).

The OTP memory unit cell 130 may include an anti-fuse, which may include a first electrode connected to the detecting node (X) and a second electrode connected to a negative voltage supply VSS. However, in the case that the read voltage generator 120 is constructed with a pull-down unit, the second electrode of the OTP memory unit cell 130 may be connected to the VDD.

The first detecting unit 140 may include a Schmitt trigger circuit 141. An input terminal of the Schmitt trigger circuit 141 may be connected to the detecting node (X). The first detecting unit 140 may include a resistance 142, which may be coupled between the Schmitt trigger circuit 141 and the detecting node (X) to protect the first detecting unit 140 from a high voltage that may be applied thereto from the detecting node (X) during the programming operation.

The determining unit 150 may include a transfer gate 151, a second detecting unit 152, a precharge unit 153, and/or the like. The transfer gate 151 may be connected between the first detecting unit 140 and the second detecting unit 152. A control terminal (e.g., gate electrode) of the transfer gate 151 may receive the read delay signal (RE_DLY). An input terminal of the second detecting unit 152 may be connected to the transfer gate 151, and an output terminal of the second detecting unit 152 may be connected to an output terminal of the determining unit 150 and the precharge unit 153. An input terminal of the precharge unit 153 may receive the read delay signal (RE_DLY). The precharge unit 153 may further include other terminals connected to the input terminal and the output terminal of the second detecting unit 152.

The transfer gate 151 may include an N-type transistor (N1). A first terminal (e.g., source electrode) of the transistor (N1) may be connected to the output terminal of the first detecting unit 140. A second terminal (e.g., drain electrode) may be connected to the input terminal of the second detecting unit 152. A control terminal (e.g., gate electrode) of the transistor (N1) may receive the read delay signal (RE_DLY). Alternatively, the transfer gate 151 may be implemented with a P-type transistor.

The second detecting unit 152 may include a first inverter 154, a second inverter 155, and/or the like. The first inverter 154 may include a pull-up unit (P2), a pull-down unit (N2), and/or the like. The pull-up unit (P2) may include a first terminal (e.g., source electrode) connected to the VDD and a control terminal (e.g., gate electrode) connected to an output terminal of the second inverter 155. The pull down unit (N2) may include a first terminal (e.g., source electrode) connected to a second terminal (e.g., drain electrode) of the pull-up unit (P2) and an output terminal of the first inverter 154. A second terminal (e.g., drain electrode) of the pull-down unit (N2) may be connected to the VSS. A control terminal (e.g., gate electrode) of the pull-down unit (N2) may be connected to a second terminal (e.g., drain electrode) of the transfer gate 151. The second inverter 155 may include an input terminal connected to the output terminal of the first inverter 154 and an output terminal connected to the control terminal of the pull-up unit (P2) of the first inverter 154. Although FIG. 1 illustrates the second inverter 155 connected to the input terminal of the pull-up unit (P2), but the second inverter 155 may be connected to the pull down unit (N2) of the first inverter 154.

The precharge unit 153 may include a first pull down unit (N3) configured to pull down the input terminal of the second detecting unit 152 and a second pull down unit (N4) to pull down the output terminal of the second detecting unit 152. The precharge unit 153 may further include a NOT gate 156 or a buffer to turn on the first and second pull down units (N3, N4) according to the read delay signal (RE_DLY) which may be input to the NOT gate 156.

The latch unit 160 may include a latch circuit 161. The latch circuit 161 may include an input terminal connected to the output terminal of the determining unit 150, an enable terminal (EN) connected to the read latch signal (RE_LAT), and an output terminal connected to an output terminal of the OTP memory read circuit 100. The latch unit 160 may further include a NOT gate 162 or a buffer for buffering the output signal from the latch circuit 161.

Figure 2:
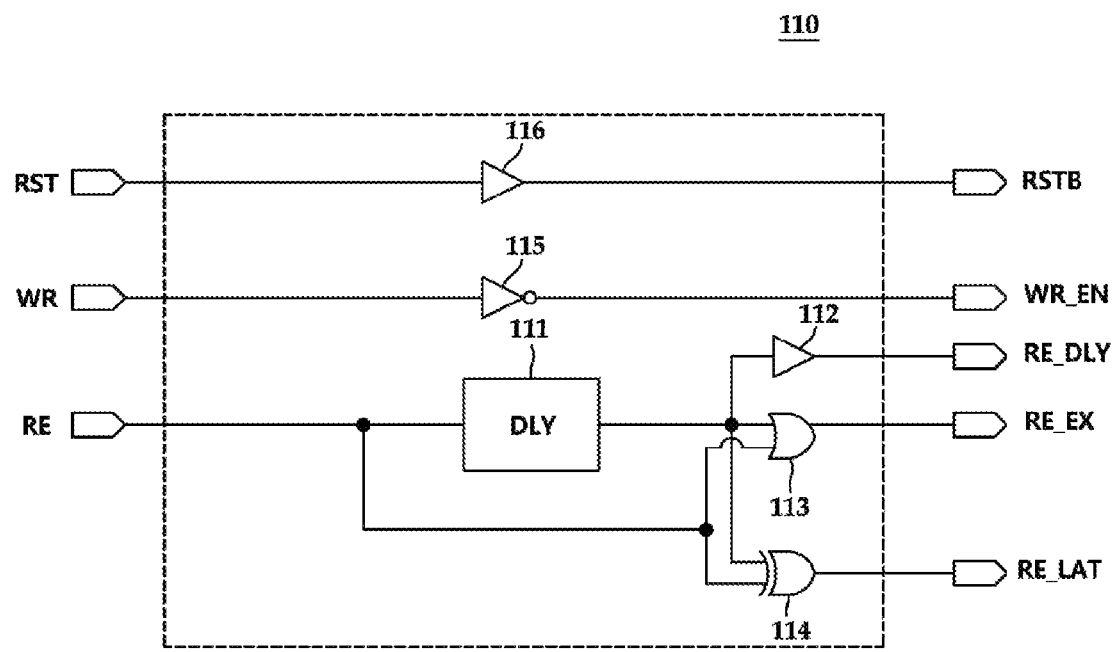
FIG. 2 illustrates an example of a controller according to an embodiment of the present description.

FIG. 2 illustrates a controller according to an embodiment of the present description, which may be the controller 110 shown in FIG. 1.

Features of the controller 110 are illustrated referring to FIG. 2. The controller 110 may include an input terminal (RE) and three output terminals (RE_EX, RE_DLY, RE_LAT). The controller 110 may include a delay circuit 111, which may be connected to the input terminal (RE), a buffer 112 that outputs the read delay signal (RE_DLY) based on an output signal from the delay circuit 111, a first logic circuit 113 that outputs the read voltage signal (RE_EX) based on the output signal from the delay circuit 111 and the read input signal (RE), and a second logic circuit 114 that outputs the read latch signal (RE_LAT) based on the output signal from the delay circuit 111 and the read input signal (RE).

The read voltage signal (RE_EX) may turn on the read voltage generator 120 when either one of the read input signal (RE) and the read delay signal (RE_DLY) is in an ON state. Herein, when a signal that turns on the read voltage generator 120 is at a high level, the read voltage signal (RE_EX) may be generated through an OR calculation of the read input signal (RE) and the read delay signal (RE_DLY). Accordingly, the first logic circuit 113 may be constructed with an OR gate.

The read latch signal (RE_LAT) may turn on the latch unit 160 during a first delay time (T_rd) at a rising edge thereof (i.e., when the read input signal (RE) is changing from a low level to a high level) and at a falling edge thereof (i.e., when the read input signal (RE) is changing from a high level to a low level). When the signal that turns on the latch unit 160 is at a high level, the read latch signal (RE_LAT) may be generated through a XOR calculation of the read input signal (RE) and the read delay signal (RE_DLY). Accordingly, the second logic circuit 114 may be constructed with a XOR gate.

The controller 110 may further include a NOT gate 115 that may output the program control signal (WR_EN) based on the program input signal (WR), and a buffer 116 that may output the reset control signal (RSTB) based on the reset input signal (RST).

Figure 3:
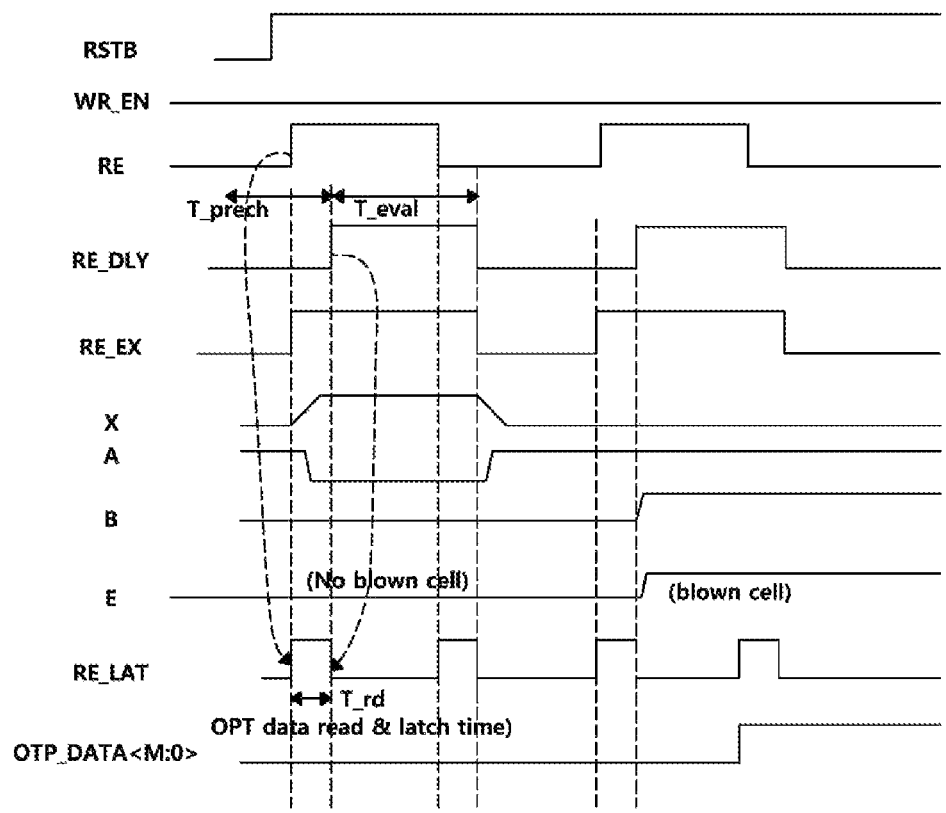
FIG. 3 illustrates waveforms of signals of a circuit for reading an OTP memory according to an embodiment of the present description.

FIG. 3 illustrates waveforms of operating signals of a circuit for reading an OTP memory according to an embodiment of the present description.

Referring to FIG. 1 to FIG. 3, detailed operations of the circuit 100 for reading an OTP memory are illustrated hereinafter.

First, before executing a read operation, the reset control signal (RSTB) may be at an ON state to activate the circuit for reading the OTP memory 100. Herein, the program control signal (WR_EN) may maintain at an OFF state.

When the read input signal (RE) is input to the controller 110, the output signal of the delay circuit 111 may be delayed for a period of the first delay time (T_rd) by the delay circuit 111, and a buffer 112 may output the read delay signal (RE_DLY) by buffering the output signal from the delay circuit 111. Accordingly, when the read input signal (RE) rises from a low level to a high level, the read delay signal (RE_DLY) may rise from a low level to a high level with a delay of the first delay time (T_rd).

The OR gate 113 may output a read voltage signal (RE_EX) through the OR calculation of the read input signal (RE) and the output signal of the delay circuit 111. Since the read voltage signal (RE_EX) is generated by the OR calculation of the read input signal (RE) and the output signal of the delay circuit 111, the read voltage signal (RE_EX) may be at a high level when one of the read input signal (RE) and the output signal from the delay circuit 111 is in a high level. Accordingly, the read voltage signal (RE_EX) may stay at a high level from a rising edge of the read input signal (RE) to a falling edge of the output signal of the delay circuit 111 or the read delay signal (RE_DLY).

The XOR gate 114 may output the read latch signal (RE_LAT) through the XOR calculation of the read input signal (RE) and the output signal of the delay circuit 111. The read latch signal (RE_LAT) may be generated through the XOR calculation of the read input signal (RE) and the output from the delay circuit 111. Therefore, when the read input signal (RE) and the output signal of the delay circuit 111 are at different levels, the read latch signal (RE_LAT) may become a high level. Accordingly, the read latch signal (RE_LAT) may become a high level for a period from a rising edge of the read input signal (RE) to a rising edge of the output signal of the delay circuit 111 or the read delay signal (RE_DLY). Also, the read latch signal (RE_LAT) may become a high level for a period from a falling edge of the read input signal (RE) to a falling edge of the output signal of the delay circuit 111 or the read delay signal (RE_DLY). That is, the read latch signal (RE_LAT) may have two clock pulses during a single period (i.e., cycle) of the read input signal (RE), and a duration of the read latch signal (RE_LAT) maintaining the high level of each clock may be equal to the period of the first delay time (T_rd).

When the read voltage signal (RE_EX) rises from a low level to a high level, the read voltage generator 120 may be turned on and apply the VDD that may be a read voltage, to the detecting node (X). Herein, the voltage of the detecting node (X) may be determined by a resistance ratio of the read voltage generator 120 and the OTP memory unit cell 130 that are connected in series. When the OTP memory unit cell 130 is not programmed (i.e., no blown cell), the voltage of detecting node (X) may be pulled up to the VDD by the read voltage generator 120. However, when the OTP memory unit cell 130 is programmed (i.e., blown cell), the charge at the detecting node (X) may be discharged to the VSS through the OTP memory unit cell 130 that is electrically shorted. Accordingly, the detecting node (X) may rise to a high level when the OTP memory unit cell 130 is not programmed. When the OTP memory unit cell 130 is programmed, the voltage at the detecting node (X) may be at a low level and maintained at the VSS or a voltage close to the VSS.

The first detecting unit 140 may receive a voltage of the detecting node (X) and may output a voltage to a node (A). When the OTP memory unit cell 130 is not programmed, the detecting node (X) may be pulled up to the VDD, and the first detecting unit 140 may output an output signal being at a low level. Further, when the OTP memory unit cell 130 is programmed, the detecting node (X) may maintain at the VSS or a voltage close to the VSS, and the first detecting unit 140 may generate an output signal being at a high level. Herein, the first detecting unit 140 may include a Schmitt trigger circuit, and thus a logic threshold voltage at a rising edge and a falling edge thereof may have different features. The Schmitt trigger circuit 141 may have the logic threshold voltage with a Hysteresis feature, and may be able to obtain a margin regarding a noise of the input signal thereto. Accordingly, even if a noise occurs at the voltage at the detecting node (X), if the noise is not over the margin of the logic threshold voltage, the output signal of the first detecting unit 140 may be stably maintained.

The signal that is output by the first detecting unit 140 may be transmitted to an input terminal of the determining unit 150. The transfer gate 151 may be turned off when the read delay signal (RE_DLY) is at a low level, thereby blocking the connection between the output terminal of the first detecting unit 140 and the input terminal of the second detecting unit 152. The transfer gate 151 may be turned on when the read delay signal (RE_DLY) is at a high level and connected to the output terminal of the first detecting unit 140 and the input terminal of the second detecting unit 152.

The precharge unit 153 may be turned on when the read delay signal (RE_DLY) is at a low level since the voltage at a node (C) becomes a high level due to the NOT gate 156. The precharge unit 153 may precharge the node (B) connected to the input terminal of the second detecting unit 152 and a node (E) connected to the output terminal of the determining unit 150 with the VSS. On the other hand, the precharge unit 153 may be turned off when the read delay signal (RE_DLY) is at a high level.

The node (B) that is connected to the transfer gate 151 and the input terminal of the second detecting unit 152 and receives the read input signal (RE) at a low level (or off state), may be precharged with the VSS by the precharge unit 153. When the read input signal (RE) is at a high level (or on state), the first delay time (T_rd) may be synchronized with the voltage of the node (A). However, as illustrated in FIG. 1, when the transfer gate 151 is formed with the N-type transistor (N1), the high voltage level of the node (B) may be limited to a voltage (VDD-Vthn), which may be dropped from the VDD in the amount of a threshold voltage (Vthn) of the N-type transistor (N1). Herein, when a P-type transistor is connected in parallel, a high voltage level of the node (B) may be synchronized with the voltage of the node (A) to the VDD.

Accordingly, when the OTP memory unit cell 130 is not programmed, the voltage at the node (B) may maintain at the VSS as a precharged voltage, and when the OTP memory unit cell 130 is programmed, the voltage at the node (B) may rise to a high level (i.e., VDD-Vthn or VDD) after the first delay time (T_rd) has lapsed in reference to the point, at which the node (A) rises to the high level.

The buffer unit 152 may output a signal buffered at the node (E) based on the voltage of the node (B). As described above, the buffer unit 152 may include the first inverter 154 and the second inverter 155, which may form a feedback loop structure. Therefore, when the voltage of the node (B) rises from a low level to a high level, the logic threshold voltage may increase. Herein, the logic threshold voltage of the buffer unit 152 may be determined by a resistance ratios of the pull-up unit (P2) and the pull-down unit (N2).

The node (D) that is connected to the output terminal of the first inverter 154 may be precharged with the VDD by the on pull-up unit (P2) that may be turned on when the read delay signal (RE_DLY) is at a high level. When the read delay signal (RE_DLY) is at a low level, the node (D) may maintain at the VDD or fall to the VSS depending on whether the OTP memory unit cell 130 is programmed or not.

The node (E) that is connected to the output terminal of the second inverter 155 may be applied with a signal that is inverted at the node (D). Accordingly, the voltage of the node (E) may maintain at the VSS when the OTP memory unit cell 130 is not programmed. When the OTP memory unit cell 130 is programmed, the voltage of the node (E) may rise to the VDD after the first delay time (T_rd) has lapsed when the read voltage signal (RE_EX) is at an on state.

The latch unit 160 may latch the signal output from the determining unit 150 while the read latch signal (RE_LAT) maintains at a high level. As afore-mentioned, the read latch signal (RE_LAT) may have two clock pulses for a single period or cycle of the read input signal (RE) and each clock may maintain at a high level during the first delay time (T_rd). The read latch signal (RE_LAT) may have a first clock at the rising edge of the read input signal (RE) and a second clock at the falling edge of the read input signal (RE).

Herein, the read delay signal (RE_DLY) may be at a low level at the first clock, and the nodes (B) and (E) may maintain at a low level by the precharge unit 153 regardless of whether the OTP memory unit cell 130 is programmed or not. However, the read delay signal (RE_DLY) may be at a high level at the second clock, and thus the signal at the node (E) may be determined depending on whether the OTP memory unit cell 130 is programmed or not. Thus, the latch unit 160 may latch the signal at the node (E) that is connected to the output terminal of the determining unit 150 for the period of the first delay time (T_rd), during which the second clock maintains at a high level.

The latch unit 160 may fix an output value after latching the signal at the node (E) during the first delay time (T_rd) from the falling edge of the read input signal (RE) that is generated after the first clock of the read latch signal (RE_LAT). Accordingly, the latch unit 160 may latch after the signal at the node (E) reaches a normal state (steady state) and may maintain an output signal as a stable state although noise may occur after the second clock becomes low level.

Accordingly, the circuit for reading OTP memory 100 may improve noise features because, during the read operation, the noise which is generated before and after the first delay time (T_rd) during which the second clock maintains at a high level, does not influence the output signal. Further, the circuit for reading the OTP memory 100 may not require or use a special amplifier to detect whether the OTP memory unit cell 130 is programmed or not, thereby eliminating a need for a larger circuit area to form additional circuitry that provides voltage and current to such amplifier.

Figure 4:
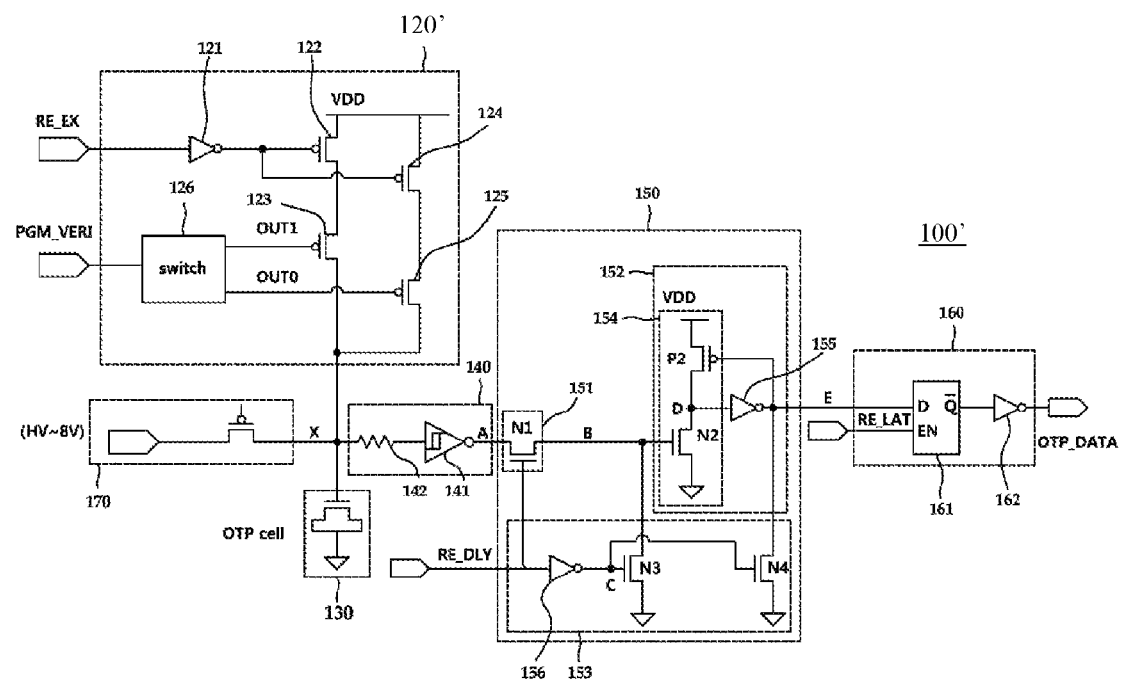
FIG. 4 illustrates an example of a circuit for reading an OTP memory applied with a read voltage generator according to another embodiment of the present description.

FIG. 4 illustrates an example of a circuit 100' for reading an OTP memory, which is constructed according to another embodiment of the present description. The circuit 100' may be similar to the circuit 100 shown in FIG. 1, except for a read voltage generator 120', which may be different from the read voltage generator 120 of the circuit 100 shown in FIG. 1.

The read voltage generator 120 may include a first pull-up unit 122 that outputs a first current amount, a first transfer gate 123 connected between the first pull-up unit 122 and the detecting node (X), a second pull-up unit 124 that outputs a second current amount, a second transfer gate 125 connected between the second pull-up unit 124 and the detecting node (X) and, a switch unit 126 that controls the first and second transfer gates 123, 125.

As aforementioned in FIG. 1, whether or not the OTP memory unit cell 130 is programmed may be determined based on detecting the voltage at the detecting node (X), and the voltage at the detecting node (X) may be determined based on a ratio between a resistance value of the read voltage generator 120 and a resistance value of the OTP memory unit cell 130. However, characteristics of a transistor may change due to various variables, such as, for example, temperature, voltage, and etc. Accordingly, the operations of an OTP memory read circuit in a test environment may differ from those in a real-life environment.

In FIG. 4, the circuit 100' may include the second pull-up unit 124 that is connected to the VDD in parallel with the first pull up unit 122 to obtain a current amount margin that is output by the read voltage generator 120'. The second pull-up unit 124 may increase the voltage at the detecting node (X) by increasing a current amount of the read voltage generator 120' at a test step. If it is determined to be a normal operation at a state that the current amount is increased, the margin may be obtained in the amount of the increased current. Accordingly, the circuit 100' may improve credibility of a test result by obtaining a margin of the current amount of the read voltage generator 100'.

The preferred embodiments of the invention have been explained so far, a person skilled in the art will understand that the invention may be implemented in modifications without departing from the basic characteristics of the invention. Accordingly, the foregoing exemplary embodiments and advantages are merely exemplary and are not to be construed as limiting the present invention. The present teaching can be readily applied to other types of apparatuses. Also, the description of the exemplary embodiments of the present inventive concept is intended to be illustrative, and not to limit the scope of the claims.

What is claimed is:

1. A circuit for reading a one time programmable (OTP) memory, comprising:
   a controller that receives a read input signal and generates a read delay signal, a read voltage signal, and a read latch signal;
   a read voltage generator that generates a read voltage based on the read voltage signal and outputs the read voltage to a detecting node;
   an OTP memory unit cell comprising a first electrode connected to the detecting node;
   a first detecting unit that determines a voltage at the detecting node;

a determining unit that delays an output signal from the first detecting unit based on the read delay signal; and a latch unit that latches an output signal from the determining unit during a first delay time at a falling edge of the read input signal based on the read latch signal.

2. The circuit of claim 1, wherein the read delay signal is generated by delaying the read input signal for a period of the first delay time, the read voltage signal is at a high level during a period from a rising edge of the read input signal to a falling edge of the read delay signal, and the read latch signal is at a high level for the period of the first delay time at a rising edge and a falling edge of the read input signal.

3. The circuit of claim 2, wherein the controller comprises a delay circuit.

4. The circuit of claim 3, wherein the controller comprises a buffer that generates the read delay signal by buffering an output signal from the delay circuit.

5. The circuit of claim 3, wherein the controller comprises a logic circuit that generates the read voltage signal based on the read input signal and an output signal from the delay circuit.

6. The circuit of claim 5, wherein the logic circuit comprises an OR gate.

7. The circuit of claim 3, wherein the controller comprises a logic circuit that generates the read latch signal based on the read input signal and an output signal from the delay circuit.

8. The circuit of claim 7, wherein the logic circuit comprises a XOR gate.

9. The circuit of claim 1, wherein the read voltage generator outputs a first current in a general mode and outputs a second current in a test mode.

10. The circuit of claim 9, wherein the second current is larger than the first current.

11. The circuit of claim 9, wherein the read voltage generator comprises:

a first pull-up unit and a second pull-up unit;

a first transfer gate connected between the first pull-up unit and the detecting node;

a second transfer gate connected between the second pull-up unit and the detecting node; and a switch unit that controls the first transfer gate and second transfer gate.

12. The circuit of claim 1, wherein the first detecting unit comprises a Schmitt trigger circuit.

13. The circuit of claim 1, wherein the determining unit comprises:

a transfer gate that blocks connection with the first detecting unit based on the read delay signal;

the second detecting unit that buffers the output signal of the first detecting unit; and a precharge unit that precharges an input terminal and an output terminal of the second detecting unit based on the read delay signal.

14. The circuit of claim 13, wherein the second detecting unit comprises a first inverter and a second inverter, an input terminal of the first inverter is connected to an output terminal of the second inverter, and an input terminal of the second inverter is connected to an output terminal of the first inverter.

15. The circuit of claim 14, wherein the first inverter comprises:

a pull-up unit comprising a gate electrode connected to the output terminal of the second inverter, and a pull-down unit comprising a gate electrode connected to the output terminal of the precharge unit.

16. The circuit of claim 13, wherein the precharge unit comprises:

a first pull-down unit that pull downs the input terminal of the second detecting unit; and a second pull-down unit that pull downs the output terminal of the second detecting unit.

17. A circuit for reading a one time programmable (OTP) memory, comprising:

a controller that receives a read input signal and generates a read voltage signal;

a read voltage generator that generates a read voltage based on the read voltage signal and outputs the read voltage to a detecting node; and an OTP memory unit cell comprising a first electrode connected to the detecting node and a second electrode connected to a negative voltage supply;

a detecting unit that determines a voltage at the detecting node;

a determining unit that delays an output signal from the detecting unit; and a latch unit that latches an output signal from the determining unit, wherein when the OTP memory unit cell is not programmed, the read voltage at the detecting node is pulled up to a positive voltage supply by the read voltage generator, and wherein when the OTP memory unit cell is programmed, an electrical short is created between the detecting node and the negative voltage supply.

18. A circuit for reading a one time programmable (OTP) memory, comprising:

a controller that receives a read input signal and generates a read voltage signal;

a read voltage generator that generates a read voltage based on the read voltage signal and outputs the read voltage to a detecting node;

an OTP memory unit cell comprising a first electrode connected to the detecting node and a second electrode connected to a negative voltage supply;

a detecting unit that determines a voltage at the detecting node;

a determining unit that delays an output signal from the detecting unit; and a latch unit that latches an output signal from the determining unit.

19. The circuit of claim 18, wherein the controller further generates a read delay signal and a read latch signal.

20. The circuit of claim 19, wherein the determining unit delays the output signal from the first detecting unit based on the read delay signal, and wherein the latch unit latches the output signal from the determining unit based on the read delay signal.

* * * * *